(12) United States Patent
Qiao et al.

(10) Patent No.: US 8,791,740 B2
(45) Date of Patent: Jul. 29, 2014

(54) SYSTEMS AND METHODS FOR REDUCING AVERAGE CURRENT CONSUMPTION IN A LOCAL OSCILLATOR PATH

(75) Inventors: Dongjiang Qiao, San Diego, CA (US);
Bhushan S. Asuri, San Diego, CA (US);
Junxiong Deng, San Diego, CA (US);
Frederic Bossu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 132 days.

(21) Appl. No.: 12/724,337

(22) Filed: Mar. 15, 2010

(65) Prior Publication Data

US 2011/0012648 A1 Jan. 20, 2011

Related U.S. Application Data

(60) Provisional application No. 61/226,165, filed on Jul. 16, 2009.

(51) Int. Cl.
*H03K 3/289* (2006.01)

(52) U.S. Cl.
USPC ............ 327/202; 327/115; 327/117; 327/203

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| | | |
|---|---|---|
| 4,061,882 A | 12/1977 | Dorren |
| 4,333,020 A | 6/1982 | Maeder |
| 4,555,777 A | 11/1985 | Poteet |
| 4,623,801 A | 11/1986 | Rocchi |
| 4,716,320 A | 12/1987 | McAdams |
| 4,959,557 A | 9/1990 | Miller |
| 4,995,589 A | 2/1991 | Adishian et al. |
| 5,097,157 A | 3/1992 | Jaffe et al. |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |

(Continued)

FOREIGN PATENT DOCUMENTS

| | | |
|---|---|---|
| CN | 1412947 A | 4/2003 |
| CN | 1904773 A | 1/2007 |

(Continued)

OTHER PUBLICATIONS

International Search Report and Written Opinion—PCT/US2010/042193, International Search Authority—European Patent Office—Mar. 24, 2011.

(Continued)

*Primary Examiner* — Brandon S Cole
(74) *Attorney, Agent, or Firm* — S. Hossain Beladi

(57) ABSTRACT

A method for reducing average current consumption in a local oscillator (LO) path is disclosed. An LO signal is received at a master frequency divider and a slave frequency divider. Output from the master frequency divider is mixed with an input signal to produce a first mixed output. Output from the slave frequency divider is mixed with the input signal to produce a second mixed output. The second mixed output is forced to be in phase with the first mixed output.

30 Claims, 13 Drawing Sheets

(56) References Cited

U.S. PATENT DOCUMENTS

| | | |
|---|---|---|
| 5,375,258 A | 12/1994 | Gillig |
| 5,477,180 A | 12/1995 | Chen |
| 5,534,803 A | 7/1996 | Correale, Jr. et al. |
| 5,682,109 A | 10/1997 | Ohmi et al. |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 * | 6/2005 | Glas et al. ............ 713/401 |
| 6,933,759 B1 | 8/2005 | Wu et al. |
| 6,967,514 B2 | 11/2005 | Kizer et al. |
| 7,027,793 B2 | 4/2006 | Gard et al. |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,545,230 B2 | 6/2009 | Jang et al. |
| 7,554,380 B2 | 6/2009 | Embabi et al. |
| 7,580,483 B2 | 8/2009 | Ibrahim et al. |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 | 7/2010 | Gschier |
| 7,750,749 B2 | 7/2010 | Jones |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,248,132 B2 | 8/2012 | Chang |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 | 3/2004 | Juntunen et al. |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0122149 A1 | 6/2005 | Cho et al. |
| 2005/0174157 A1 | 8/2005 | Calo et al. |
| 2006/0035617 A1 * | 2/2006 | Kim ..................... 455/323 |
| 2006/0059376 A1 | 3/2006 | Ngo et al. |
| 2006/0067424 A1 | 3/2006 | Wolf |
| 2006/0119446 A1 | 6/2006 | Li et al. |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 * | 4/2008 | Luff ..................... 455/209 |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 * | 10/2009 | Oh ..................... 327/115 |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0130139 A1 | 5/2010 | Panikkath et al. |
| 2010/0194485 A1 | 8/2010 | Chawla et al. |
| 2010/0198540 A1 | 8/2010 | Yanagisawa et al. |
| 2010/0226459 A1 | 9/2010 | Park et al. |
| 2011/0001522 A1 | 1/2011 | Chan et al. |
| 2011/0043291 A1 | 2/2011 | Fagg |
| 2011/0050296 A1 | 3/2011 | Fagg |
| 2011/0181330 A1 * | 7/2011 | Oh ..................... 327/208 |
| 2013/0012150 A1 | 1/2013 | Panikkath et al. |
| 2013/0271188 A1 | 10/2013 | Chan |
| 2013/0328707 A1 | 12/2013 | Choksi et al. |
| 2013/0336143 A1 | 12/2013 | Choksi et al. |

FOREIGN PATENT DOCUMENTS

| | | |
|---|---|---|
| EP | 0398751 A2 | 11/1990 |
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |

(56) References Cited

FOREIGN PATENT DOCUMENTS

| | | |
|---|---|---|
| JP | H01314013 A | 12/1989 |
| JP | 2058951 A | 2/1990 |
| JP | 2060330 U | 5/1990 |
| JP | 2131615 A | 5/1990 |
| JP | H03262317 A | 11/1991 |
| JP | H04152711 A | 5/1992 |
| JP | 5268000 A | 10/1993 |
| JP | 7170162 A | 7/1995 |
| JP | 9046195 A | 2/1997 |
| JP | 9191238 A | 7/1997 |
| JP | H09284125 A | 10/1997 |
| JP | 10111674 A | 4/1998 |
| JP | 10247842 A | 9/1998 |
| JP | 2000295090 A | 10/2000 |
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004129255 A | 4/2004 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| JP | 2010539819 A | 12/2010 |
| JP | 5235746 B2 | 7/2013 |
| KR | 20050055925 A | 6/2005 |
| KR | 20080019156 A | 3/2008 |
| TW | 200305312 A | 10/2003 |
| TW | 200529566 | 9/2005 |
| TW | 200723676 | 6/2007 |
| TW | I283515 B | 7/2007 |
| WO | WO9621270 A1 | 7/1996 |
| WO | WO9912259 A2 | 3/1999 |
| WO | WO0129965 A1 | 4/2001 |
| WO | WO0251091 A1 | 6/2002 |
| WO | 02052691 A1 | 7/2002 |
| WO | 2004047324 A1 | 6/2004 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-p. 279.

Chan, et al., "Hercules (RTR9800) Divider", Aug. 2005.

Chan, "Hercules (RTR8700) Divider", Aug. 2005.

Co-pending U.S. Appl. No. 13/011,716, filed Jan. 21, 2011.

Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA,IEEE, US, May 5, 1997, pp. 411-414, XP010235334, DOI: 10.1109/CICC.1997.606656 ISBN: 978-0-7803-3669-8.

Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY: IEEE, US, Oct. 2, 2000, p. 106/107, XP001003452, ISBN: 978-0-7803-6390-8 p. 106; figure 3.

Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.

\* cited by examiner

SYSTEMS AND METHODS FOR REDUCING AVERAGE CURRENT CONSUMPTION IN A LOCAL OSCILLATOR PATH

RELATED APPLICATIONS

This application is related to and claims priority from U.S. Provisional Patent Application Ser. No. 61/226,165 filed Jul. 16, 2009, for "Systems and Methods for Reducing Average Current Consumption in a Local Oscillator Path."

TECHNICAL FIELD

The present disclosure relates generally to communication systems. More specifically, the present disclosure relates to systems and methods for reducing average current consumption in a local oscillator path.

BACKGROUND

Wireless communication systems have become an important means by which many people worldwide have come to communicate. A wireless communication system may provide communication for a number of mobile devices, each of which may be serviced by a base station. Examples of mobile devices include cellular phones, personal digital assistants (PDAs), handheld devices, wireless modems, laptop computers, personal computers, etc.

Mobile devices may include a variety of digital circuits used during operation. For example, an oscillator may be used to synchronize various circuits across a board or integrated circuit within a mobile device. Furthermore, different circuits within a mobile device may operate using different frequencies. Therefore, mobile devices may use multiple oscillators for different purposes.

However, like other portable electronic devices, mobile devices may have limited battery life. Along with other types of circuits, oscillators consume current during operation, thus shortening battery life. Therefore, benefits may be realized by improved methods and apparatus for reducing the consumption of current in mobile devices during the operation of wireless communication systems.

SUMMARY

A method for reducing average current consumption in a local oscillator (LO) path is disclosed. An LO signal is received at a master frequency divider and a slave frequency divider. Output from the master frequency divider is mixed with an input signal to produce a first mixed output. Output from the slave frequency divider is mixed with the input signal to produce a second mixed output. The second mixed output is forced to be in phase with the first mixed output.

In one configuration, the forcing may include determining a phase difference between output from the master frequency divider and output from the frequency divider and inverting the phase of the slave frequency divider using a cross-coupled switch if there is a phase difference. The inverting may include inverting the output of the slave frequency divider, inverting the second mixed output, or inverting the input signal before it is mixed with the output of the slave frequency divider.

The first mixed output and the second mixed output may be summed The input signal may be a radio frequency signal and the first mixed output and second mixed output may be baseband signals. Alternatively, the input signal may be a baseband signal and the first mixed output and the second mixed output may be radio frequency signals. The local oscillator (LO) signal may be generated by a voltage controlled oscillator (VCO). The output from the master frequency divider may be buffered by a first output buffer and the output from the slave frequency divider may be buffered by a second output buffer. The slave frequency divider may be powered on in response to a change in gain requirements for the local oscillator (LO) path.

A fully split local oscillator (LO) path is also disclosed. The LO path includes a master frequency divider and a slave frequency divider configured to receive an LO signal. The LO path also includes a first mixer configured to mix output from the master frequency divider with an input signal to produce a first mixed output. The LO path also includes a second mixer configured to mix output from the slave frequency divider with the input signal to produce a second mixed output. The LO path also includes a control module configured to force the second mixed output to be in phase with the first mixed output.

A fully split local oscillator (LO) path is also disclosed. The LO path includes means for receiving an LO signal at a master frequency divider and a slave frequency divider. The LO path also includes means for mixing output from the master frequency divider with an input signal to produce a first mixed output. The LO path also includes means for mixing output from the slave frequency divider with the input signal to produce a second mixed output. The LO path also includes means for forcing the second mixed output to be in phase with the first mixed output.

A computer-readable medium is also disclosed. The computer-readable medium is encoded with computer-executable instructions. The instructions are for receiving an LO signal at a master frequency divider and a slave frequency divider. The instructions are also for mixing output from the master frequency divider with an input signal to produce a first mixed output. The instructions are also for mixing output from the slave frequency divider with the input signal to produce a second mixed output. The instructions are also for forcing the second mixed output to be in phase with the first mixed output.

DETAILED DESCRIPTION

A local oscillator (LO) may be used in mobile devices to convert a particular signal to a different frequency. For example, a high frequency signal may be converted to a lower, baseband signal or vice versa using an LO. In addition to an oscillator, such as a voltage controlled oscillator (VCO), an LO may include an LO path that may include one or more buffers, frequency dividers, and mixers. The LO path may process the output of the oscillator to achieve a desired output. This processing may consume relatively large amounts of current, thus reducing battery life of devices, such as mobile devices.

Traditionally, only one LO path may be used for each operating frequency. However, this may be inefficient because an input buffer, an output buffer, and frequency divider may consume maximum current even if the full capacity of the buffers are not needed, i.e., less than full gain is needed on the LO path output or a noise level higher than the minimum is acceptable. In some configurations, the LO path may be split to more reduce average current consumption. Although this may be more efficient than using an LO path that is not split, phase synchronization problems may arise between the segments of the split LO path, especially during times of transition between LO path segments or addition of the signals on the LO path segments. In other words, since a frequency divider in an LO segment may initially produce an output with a phase that is difficult to predict, different segments within the same LO path may have different phases that may cause unwanted signal cancellation.

Therefore, the present systems and methods may implement a fully split LO path, in which one or more phase detectors are used to detect any phase differences between LO segments. Furthermore, cross-coupled switches may be used to change the polarity of segment mixer inputs or outputs. The split LO path may allow for current reduction and gain control.

Figure 1:
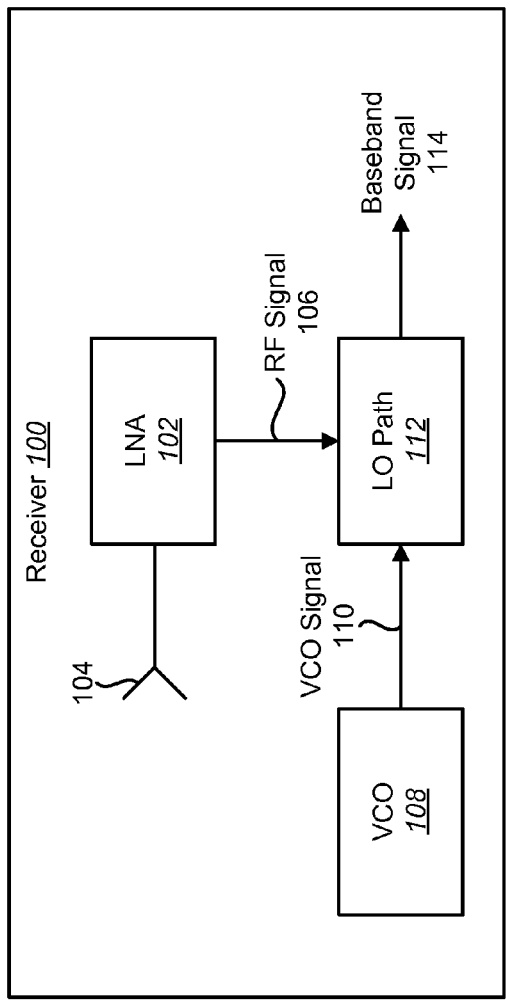
FIG. 1 is a block diagram illustrating a receiver for reducing current in a local oscillator (LO) path.

FIG. 1 is a block diagram illustrating a receiver 100 for reducing current in a local oscillator (LO) path 112. The receiver 100 may be part of a mobile device or base station designed for wireless communication. The receiver 100 may include, among other things, a low noise amplifier (LNA) 102, a VCO 108, and an LO path 112. The LNA 102 may receive a wireless communication signal received at an antenna 104. The LNA 102 may amplify the received signal to usable levels and produce a radio frequency (RF) signal 106, i.e., a representation of the original signal sent. The VCO 108 may be a device that outputs a VCO signal 110 with a frequency based on a direct current (DC) voltage level at the VCO 108 input. The LO path 112 may receive the RF signal 106 from the LNA 102 and the VCO signal 110 from the VCO 108 and use one or more buffers, frequency dividers, mixers, and summers to produce a baseband signal 114. The baseband signal 114 may be the actual reconstructed audio received by a microphone on a transmitting device, e.g., voiced speech. Thus, the receiver 100 may use the LO path 112 to reconstruct the baseband signal 114.

Figure 2:
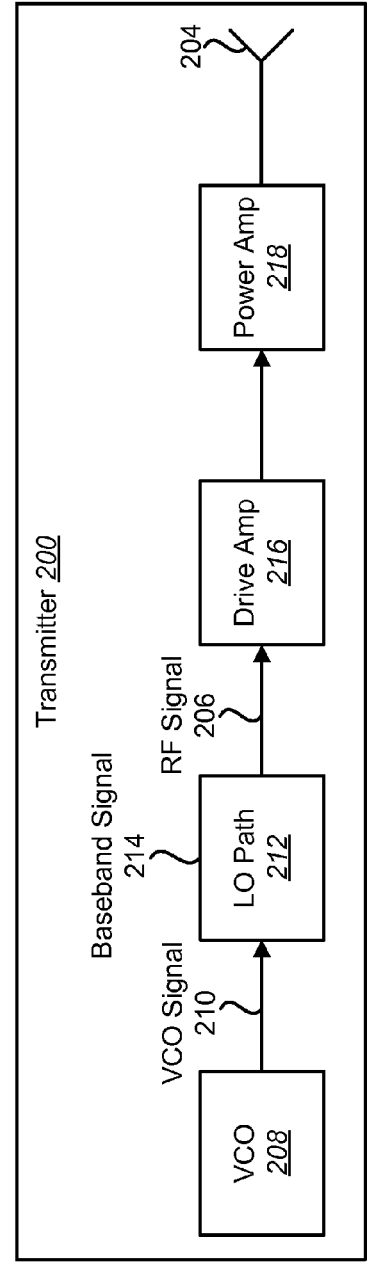
FIG. 2 is a block diagram illustrating a transmitter for reducing current in an LO path.

FIG. 2 is a block diagram illustrating a transmitter 200 for reducing current in an LO path 212. The transmitter 200 may be part of a mobile device that may also include the receiver 100 illustrated in FIG. 1. The transmitter 200 may include, among other things, a VCO 208, an LO path 212, a drive amplifier 216, and a power amplifier 218. The LO path 212 may receive a VCO signal 210 and a baseband signal 214 (e.g., voiced speech), and use one or more buffers, frequency dividers, mixers, and summers to produce an RF signal 206. In other words, the transmitter 200 may use the LO path 212 to produce a modulated, high frequency RF signal 206 to be transmitted. Before the RF signal 206 is transmitted via an antenna 204, it may be amplified by a drive amplifier 216, a power amplifier 218, or both. Thus, the transmitter 200 may use the LO path 212 to construct an RF signal 206 for transmission.

Figure 3:
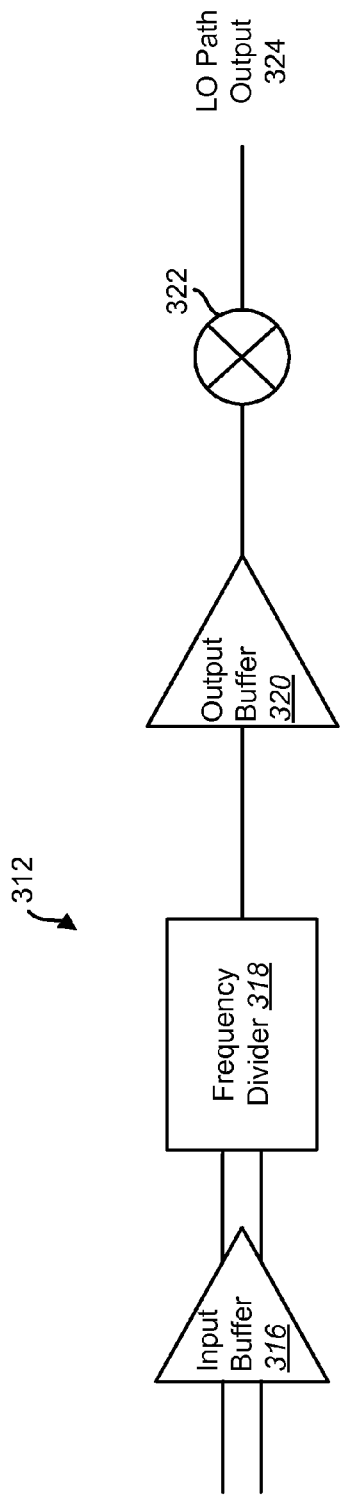
FIG. 3 is a block diagram illustrating an LO path.

FIG. 3 is a block diagram illustrating an LO path 312. The LO path 312 may be used with the present systems and methods to reduce average current consumption. As used herein, the term "LO path" refers to the combination of at least a frequency divider 318 and a mixer 322. The LO path 312 may also include an input buffer 316 and an output buffer 320. Among other functions, LO paths 312 may be used in a receiver 100 or a transmitter 200 to produce a baseband signal 114 or an RF signal 206 at a particular amplitude, respectively. In one configuration, an LO path 312 may include a single input buffer 316, a single frequency divider 318, a single output buffer 320, and a single mixer 322.

When the LO path 312 is operating, the input buffer 316 and the frequency divider 318 may be turned on with full size. The LO path output 324 may need different gains for different situations, e.g., high gain for a mobile device far away from a base station, low gain for a mobile device close to a base station, high noise, low noise, etc. However, regardless of the operating mode (high gain, low gain, etc.), the frequency divider 318 may only be capable of operating at full power, even if partial operation is needed, e.g., a signal with maximum amplitude or lowest noise is not necessary at the LO path output 324. In other words, due to long distance routing, lossy substrate, large loading capacitance, and high operation frequency, the LO path 312, including drive amplifiers 216 and the frequency divider 318, may consume high current. It may be desirable to reduce this LO current. Therefore, the LO path 312 may be split into smaller segments. Depending on system requirements, the LO path 312 may work in a mode with one or all segments being turned on. As a result, the average current consumed by the LO path 312 segments may be reduced.

Figure 4:
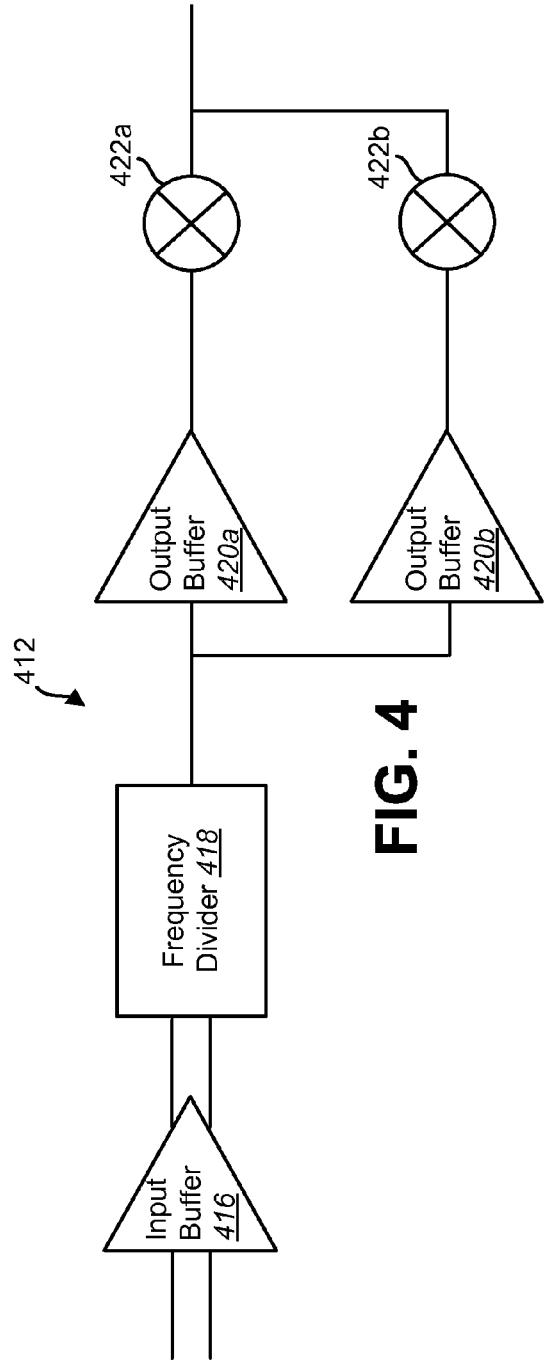
FIG. 4 is a block diagram illustrating an LO path that is partially split into segments.

FIG. 4 is a block diagram illustrating an LO path 412 that is partially split into segments. In this configuration, the LO path 412 may split the output buffer 420 and mixer 422, but use one input buffer 416 and one frequency divider 418. In other words, the output buffer 420 may be split into a first output buffer 420a and a second output buffer 420b. Likewise, the mixer 422 may be split into a first mixer 422a and a second mixer 422b. This may allow the average current consumption of the output buffer 420 and the mixer 422 to be reduced. However, the input buffer 416 and the frequency divider 418 may still consume high current when only part of the output buffer 420 and mixer 422 are selected to work, i.e., the input buffer 416 and frequency divider 418 may be consume more current than is needed when only the first output buffer 420a and first mixer 422a or the second output buffer 420b and second mixer 422b are used. Therefore, the LO path 412 illustrated in FIG. 4 may be more efficient than the LO path 312 illustrated in FIG. 3, but may still consume more current in the input buffer than is needed.

Figure 5:
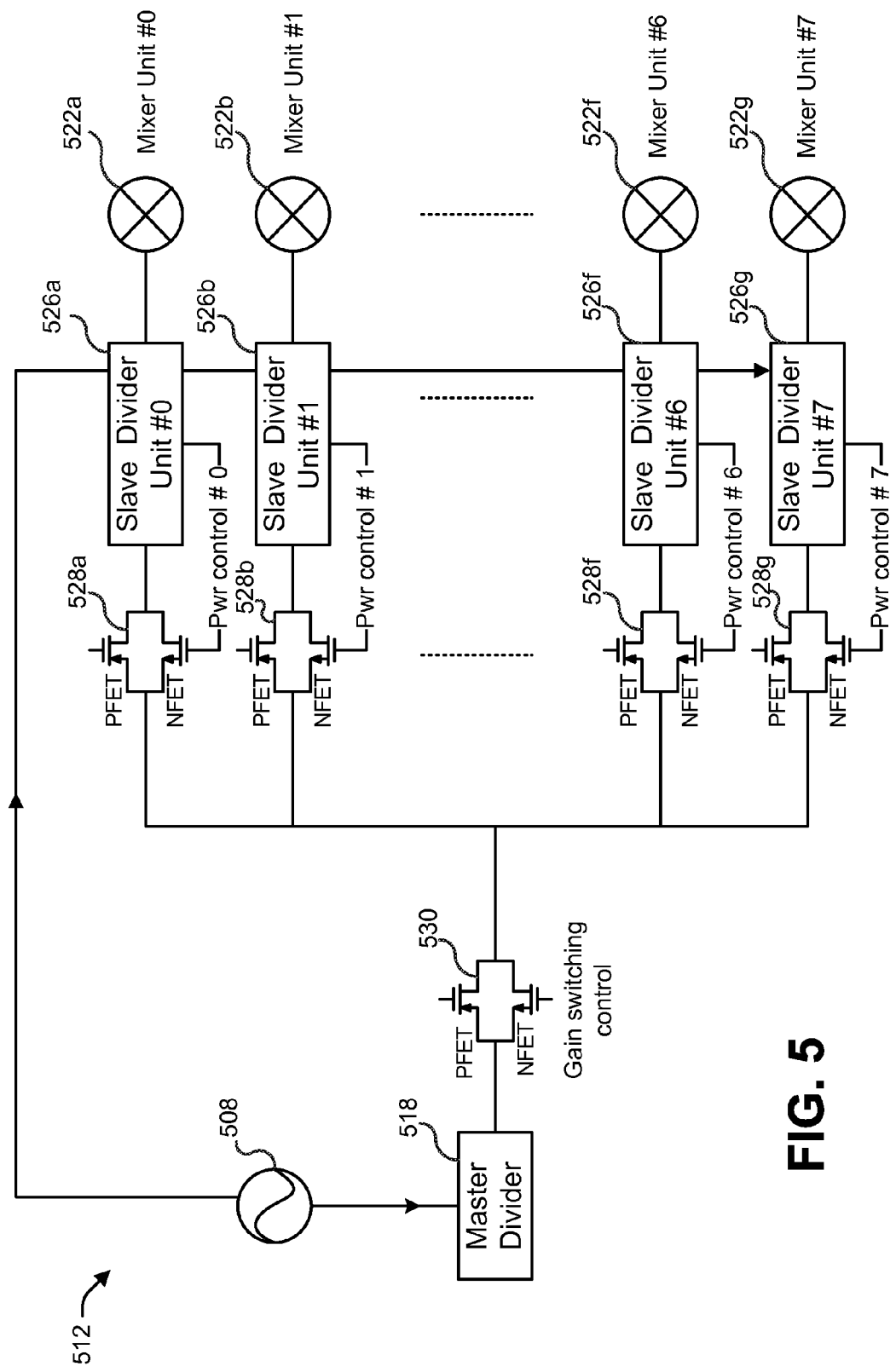
FIG. 5 is a block diagram illustrating an LO path that is fully split into segments.

FIG. 5 is a block diagram illustrating an LO path 512 that is fully split into segments. In other words, the LO path 512 illustrated in FIG. 5 may be a more detailed illustration of the partially split LO path 412 in FIG. 4. In one configuration, the LO path 512 may include a master frequency divider 518 and a plurality of slave frequency divider units 526a-g. While eight slave frequency divider units 526 are illustrated, the present systems and methods are not limited to any particular number of slave frequency divider units 526. The master divider 518 may output a reference signal to each slave divider unit 526, respectively. The master divider 518 may not require high performance with excellent phase noise. For example, the master divider 518 may be any conventional low-power divider to save power while providing a master clock phase. Additionally, any one of the slave divider units 526 may act as the master divider 518 and generate a reference signal to be sent to each slave divider unit 526.

Respective power controls 528a-g may be powered on to operate the slave frequency divider units 526 until the phases of the slave divider units 526 are synchronized to the reference signal output from the master divider 518. An oscillating signal from a digitally (or voltage) controlled oscillator 508 (e.g., VCO 108), may be input to each slave frequency divider unit 526 and may be used by the slave frequency divider units 526 to synchronize their respective phases to the reference signal. Additionally, a gain switching control unit 530 may perform gain switching for each of the LO path 512 segments.

After a slave frequency divider unit 526 is synchronized to the reference signal from the master divider 518, the respective slave frequency divider unit 526 may be delay powered on using its respective power control 528. Thereafter, the master divider 518 may be turned to a low-power state to save power. The synchronized slave divider unit(s) 526 may then, for example, output a generated clock signal to a respective mixer unit 522a-g. The generated clock signals may be used for various applications within a receiver 100, transmitter 200, or other module.

Since each powered-on slave frequency divider unit 526 may be synchronized (i.e., in phase) with the constant reference signal generated by the master divider 518, it follows that each slave divider unit 526 will be in phase with each other as well.

Figure 6:
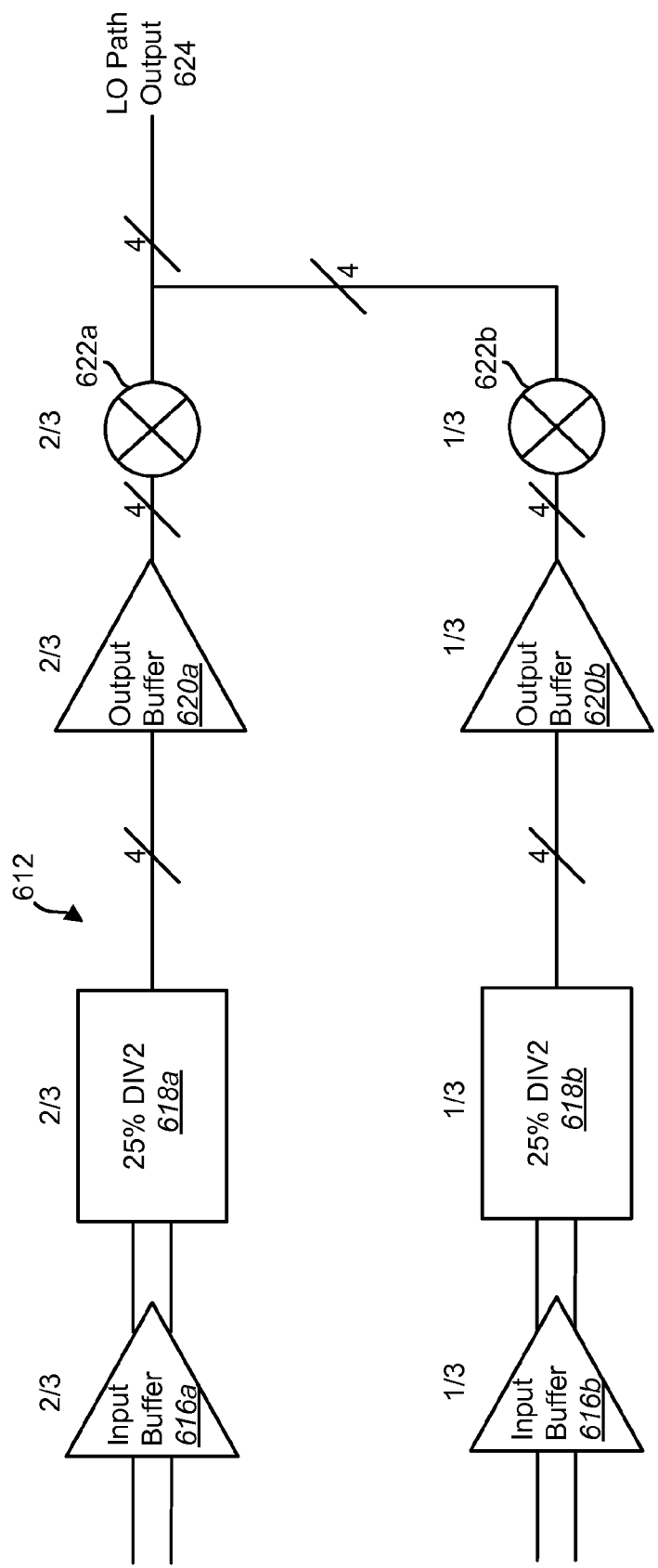
FIG. 6 is another block diagram illustrating an LO path that is fully split into segments.

FIG. 6 is another block diagram illustrating an LO path 612 that is fully split into segments. In this configuration, an input buffer 616, frequency divider 618, output buffer 620, and mixer 622 may be split into smaller components. In other words, each LO path 612 segment may be a fully functional LO path 612 and include an input buffer 616, a frequency divider 618, an output buffer 620, a mixer 622, and a cross-coupled switch (not shown). For example, a first segment may include a first input buffer 616a, a first frequency divider 618a, a first output buffer 620a, and a first mixer 622a. Likewise, a second segment may include a second input buffer 616b, a second frequency divider 618b, a second output buffer 620b, and a second mixer 622b. Alternatively, the LO may be split into more than 2 segments. Each of the frequency dividers 618 may divide by the same ratio, e.g., divide by 25%, 50%, etc.

This fully split LO path 612 may reduce the average LO current used during operation mode since the LO may operate with only some of the segments powered on while other segments are powered off In other words, the master divider 518 illustrated in FIG. 5 may be required, for at least a period of time, to operate at full power even when only one of the segments is needed. In contrast, if the second segment in the LO path 612 illustrated in FIG. 6 is not needed for a particular operation mode, the second frequency divider 618b may not be powered on at all, thus resulting in average current reduction in the LO path 612. Each segment in the LO path 612 may have different characteristics. For example, components in a first segment may be ⅔ of the total size of the LO path 612 and components in a second segment may be ⅓ of the total size of the LO path 612. These ratios may also roughly approximate the load (input capacitance) of each segment and/or current consumption of each segment. The segment output(s) may be summed to produce an LO path output 624. Therefore, one or more segments may selectively be turned on to generate a desired LO path output 624. In other words, the number of working segments may be determined depending on system requirements, such as gain, noise, linearity, etc., and process variation of the operating environment. Therefore, the LO path 612 illustrated in FIG. 6 may reduce average current consumption compared to the LO path 512 illustrated in FIG. 5, the LO path 412 illustrated in FIG. 4, and the LO path 312 illustrated in FIG. 3. Additionally, the master divider 518 illustrated in FIG. 5 may need to be relatively big compared to the dividers 618 illustrated in FIG. 6 in order to keep the divider 518 output phase unchanged when increasing or decreasing segments of operation.

In addition to reducing average current consumption in the LO path 612, a fully split configuration may also present synchronization challenges. The first frequency divider 618a may start with a different phase than the second frequency divider 618b. As a result, the output signal of the first mixer 622a and the output signal of the second mixer 622b may cancel each other out unintentionally. This may be a problem in two situations. First, if a mobile device is transitioning from a first segment to a second segment because operation mode requirements have changed, e.g., the mobile device has moved closer to the base station and needs a lower gain. In this situation, the phase of the first segment should be maintained in the second segment through the transition, i.e., LO phase should be retained during gain change. However, when the second segment starts, the initial phase may be hard to predict. Secondly, if a mobile device is using a first segment and then adds a second segment, the second segment should also be in-phase with the first segment. Therefore, in order to maintain phase during transition to or addition of new segments during operation, the frequency dividers 618a-b may be synchronized.

Figure 7:
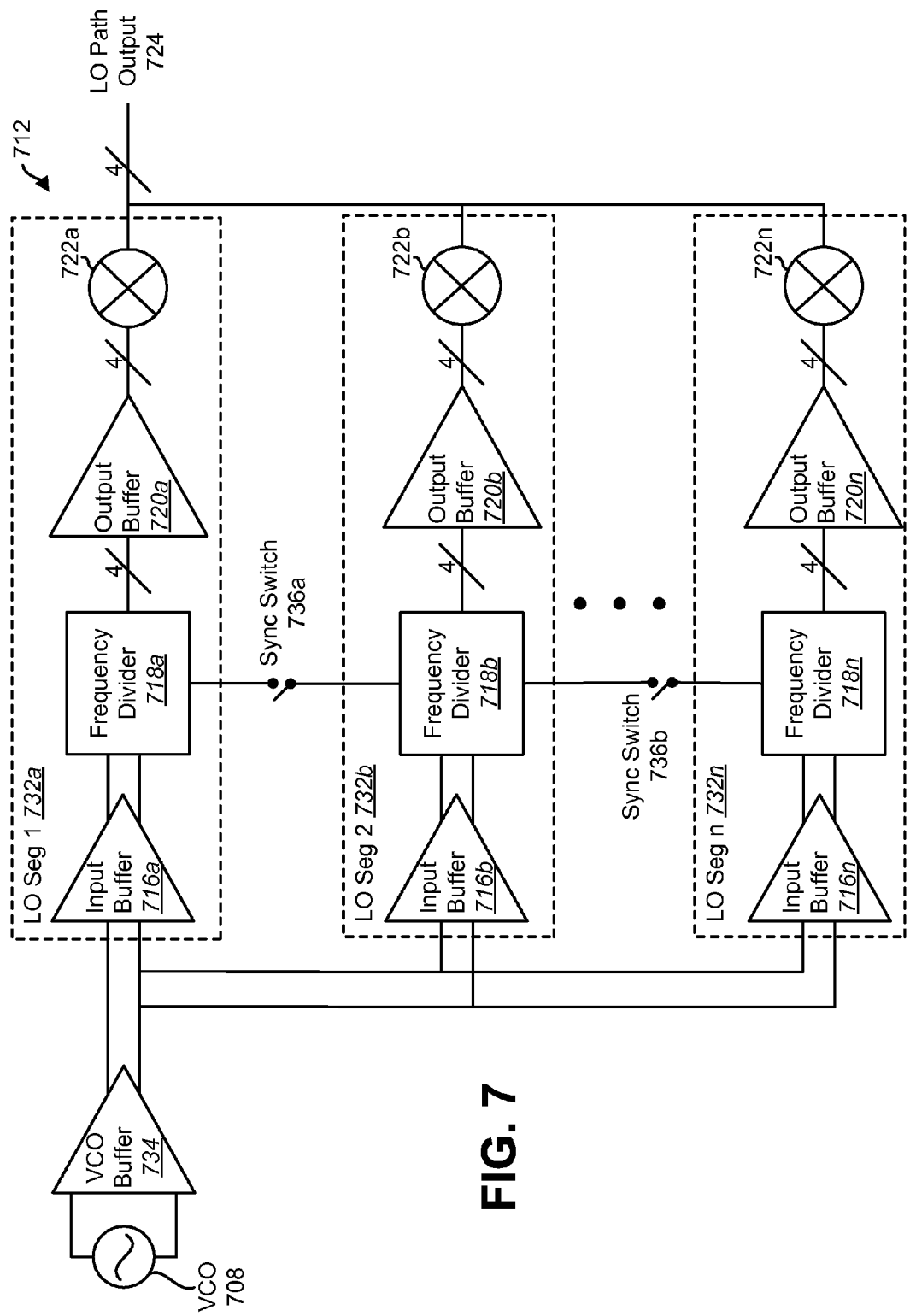
FIG. 7 is a block diagram illustrating an LO path that is fully split into synchronized segments.

FIG. 7 is a block diagram illustrating an LO path 712 that is fully split into synchronized segments 732a-n. The LO path 712 may be split into n segments 732 that each include an input buffer 716a-n, a frequency divider 718a-n, an output buffer 720a-n, and a mixer 722a-n. The output of a VCO 708 may be buffered by a VCO buffer 734 and then fed into the segments 732. Each segment 732 may be selected to work individually or together with other segments 732, depending on the desired mode of operation. If more than one segment 732 is on, the output of the operating segments 732 may be summed to produce the LO path output 724.

Additionally, synchronization switches 736 may be used to synchronize the phase of the frequency dividers 718 and to avoid phase jump during transition between segments 732 or addition of segments 732 during operation. The switches 736 may be implemented by linking the internal nodes of multiple frequency dividers 718. For example, a first switch 736a may link the internal nodes of the first frequency divider 718a and the second frequency divider 718b. Likewise, a second switch 736b may link the internal nodes of the second frequency divider 718b and the nth frequency divider 718n. There may also be a third switch (not shown) linking the internal nodes of the first frequency divider 718a and the nth frequency divider 718n. Linking internal nodes may force the phase of the second frequency divider 718b to coincide with the phase of the first frequency divider 718a. These synchronization switches 736, however, may load the frequency dividers 718.

Furthermore, the maximum operation frequency may drop due to parasitic capacitances related to the switches 736.

Figure 8:
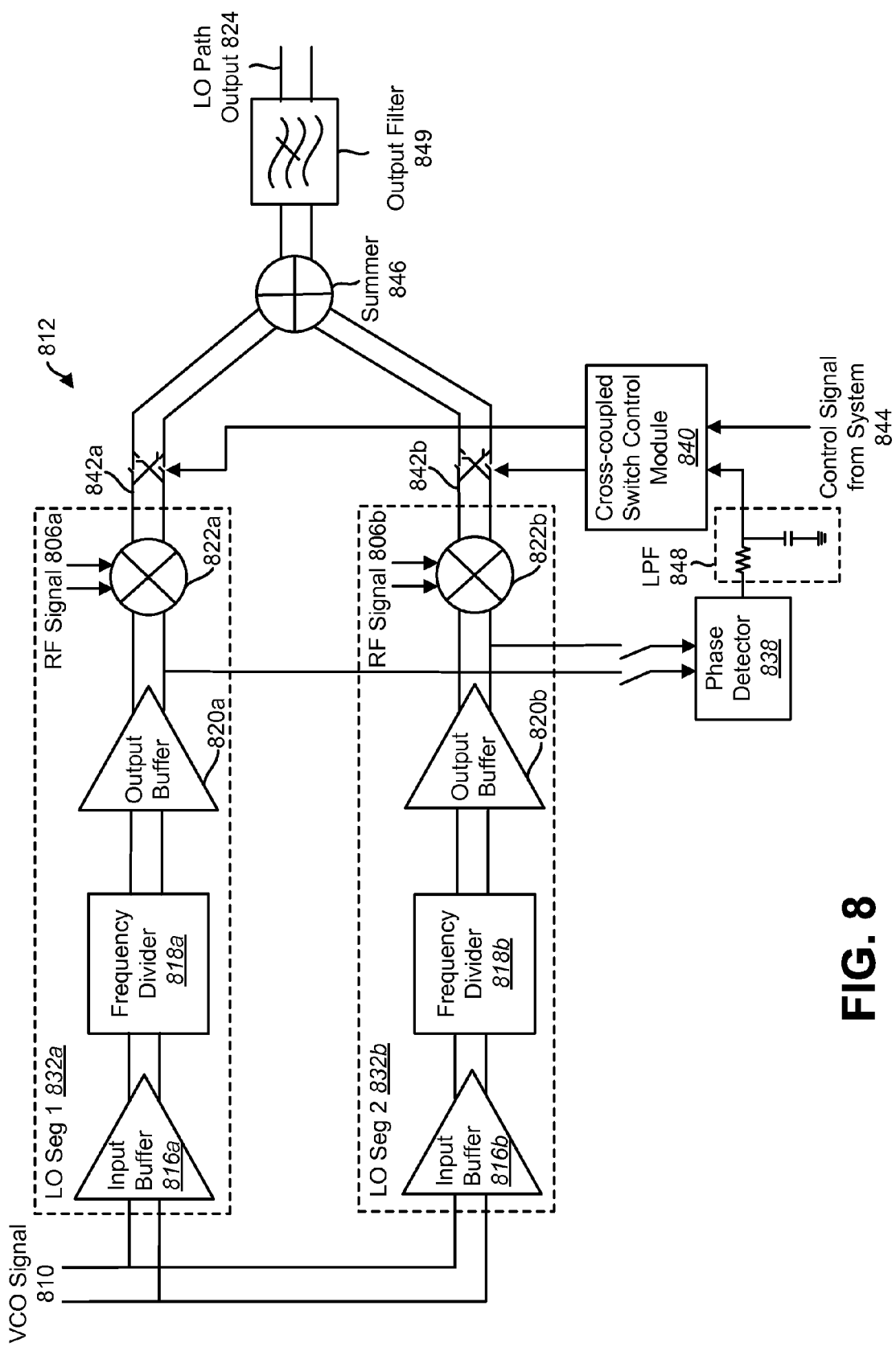
FIG. 8 is another block diagram illustrating an LO path that is fully split into synchronized segments.

FIG. 8 is another block diagram illustrating an LO path 812 that is fully split into synchronized segments 832. In this configuration, the segments 832 may be synchronized using cross-coupled switches 842 that are controlled by a phase detector 838. Each segment 832*a-b* may receive a VCO signal 810 and use an input buffer 816*a-b*, a frequency divider 818*a-b*, an output buffer 820*a-b*, and a mixer 822*a-b* to produce a segment 832 output. As before, each segment 832 may work in a mode in which one or more segments are turned on. The segment output of each operating segment 832 may be summed using a summer 846 and filtered with an output filter 849 to produce an LO path output 824, e.g., baseband signal 114. However, as discussed above, the segment outputs may be out of phase with each other if synchronization is not performed.

Since the LO path segments 832 may operate using the same differential VCO signal 810, the phase difference for two segments 832 may be 180 degrees or 0 degrees, but nothing else. If two segments 832 are out of phase with each other, (i.e., the phase difference is 180 degrees), the segment 832 outputs may be destructively summed, causing an incorrect LO path output 824. Therefore, each LO path segment 832 may include a cross coupled switch 842. The cross-coupled switches 842 may be devices that are capable, when operating, to invert a differential signal or allow a differential signal to remain unchanged. Furthermore, the cross-coupled switches 842 may be turned off to allow nothing through. In other words, a first cross coupled switch 842*a* may, when commanded, reverse the polarity of the inputs or output of the mixers 822, e.g., the segment 832 output, the RF signal 806*a-b*, the output of the output buffer 820, etc. Including the cross-coupled switches 842 on a low-frequency signal, (e.g., baseband signal 114), may result in better performance.

For the purposes of illustration, assume that a mobile device is using a first segment 832*a* and then transitions to or adds a second segment 832*b*. As before, the LO path 812 may include a large number of segments 832, any combination of which may be used together, i.e., one or more of the segments 832 may be turned on during operation. The first segment 832*a* to power on is referred to herein as the "master" segment 832*a*, i.e., the segment 832*a* to which subsequent slave segments 832*b* should synchronize. Thereafter, when the second segment 832*b* is turned on, (i.e., a slave segment 832*b* with a phase that should synchronize to the already-powered-on master segment 832*a*), the relative phase of LO signals of the master segment 832*a* and slave segment 832*b* may be measured by the phase detector 838. If the LO signals in the master segment 832*a* and slave segment 832*b* are in-phase, the LO signal polarity of the slave segment 832*b* may remain unchanged. Otherwise, if the phase difference is 180 degrees, the polarity of the slave segment 832*b* may be flipped by the second cross-coupled switch 842*b* after the mixer 822*b*. The phase detector 838 may use the in-phase component (I) or quadrature component (Q) or both as the inputs to measure the phase difference between the slave segment 832*b* output and the master segment 832*a* output. Both I and Q may be controlled at the same time. One example of a phase detector 838 is an exclusive or (XOR) logic gate or XOR function. A low pass filter (LPF) 848 may attenuate any noise on the phase detector 838 output.

A cross-coupled switch control module 840 may be used to control the cross-coupled switches 842 based on the phase detector 838 output and a control signal 844 from the system, e.g., gain control or current saving information sent from a processor on a mobile device or other device. The control module 840 may be implemented at a system level, by a local state machine, or using local static logic gates. For example, the control module 840 may not change the slave segment 832*b* if there is no phase difference ("THROUGH"), or reverse the slave segment 832*b* polarity if there is a phase difference ("CROSS_COUPLE"). A sample control algorithm is shown below:

---
Power on cross_coupled switch j:

if working_segment_set is empty
    Initialize MASTER_LO = j;
    Set cross_coupled_switch j to THROUGH;
    Add j to working_segment_set;
else
    Add j to working_segment_set;
    if phase detector output (MASTER_LO,j) = 1 (in phase)
        set cross_coupled switch j to THROUGH
    else
        set cross_coupled switch j to CROSS_COUPLE
    end
end

---

---
Turn off cross_coupled_switch j:

delete j from working_segment_set;
if MASTER_LO == j AND working_segment_set is not empty
    set MASTER_LO = m (m is any segment in
    working_segment_set);
end
Set cross_coupled_switch j to OFF

---

The cross coupled switch 842 corresponding to the master segment 842 may not be turned off as long as any segment 832 is on. Therefore, when turning a cross-coupled switch 842 off, the control module 840 may first check if the cross-coupled switch 842 corresponds to the master segment 842. If it does, the control module 840 may designate another segment 832 as the master segment before turning the cross-coupled switch 842 off However, if the cross-coupled switch 842 to be turned off corresponds to the only segment 832 on, then no other segment 832 may be designated as the master segment.

Figure 9:
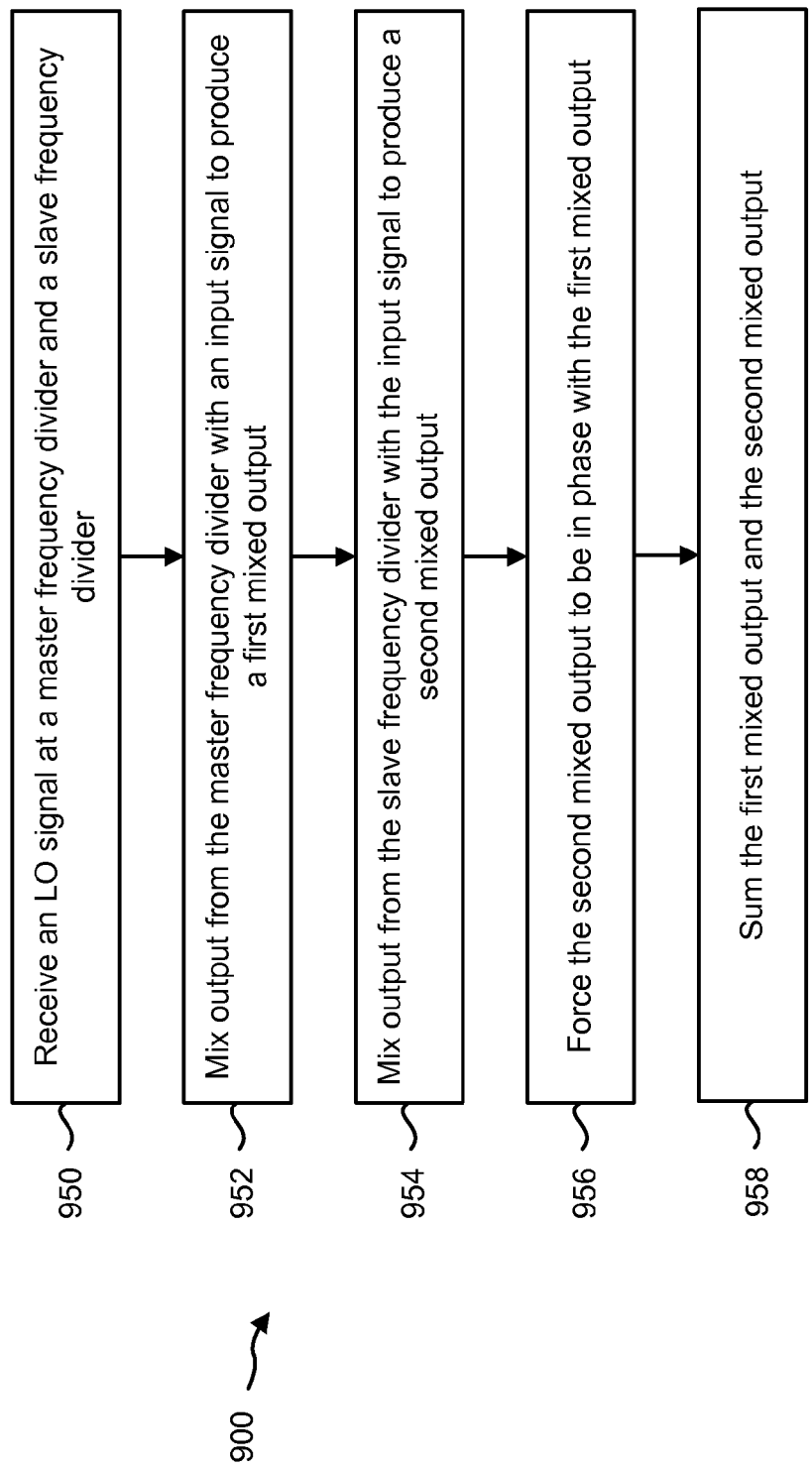
FIG. 9 is a flow diagram illustrating a method for reducing average current consumption in an LO path.

FIG. 9 is a flow diagram illustrating a method 900 for reducing average current consumption in an LO path 812. The method 900 may be performed in an LO path 812 in a receiver 100 as illustrated in FIG. 1, a transmitter 200 as illustrated in FIG. 2, or other module. As with the description above, a first frequency divider 818*a* will be referred as the master frequency divider 818*a* and a second frequency divider 818*b* will be referred to as the slave frequency divider 818*b*, although many different combinations are possible, e.g., more than two segments 832 in the LO path 812 with more than one slave frequency divider 818*b*. The master frequency divider 818*a* and the slave frequency divider 818*b* may receive 950 an LO signal. A first mixer 822*a* may mix 952 output from the master frequency divider 818*a* with an input signal to produce a first mixed output. For example, the first mixer 822*a* may mix 952 the output of the master frequency divider 818*a* with an RF signal 806*a* in a receiver 100 to produce a baseband signal 114. Alternatively, the first mixer 822*a* may mix 952 the output of the master frequency divider 818*a* with a baseband signal 214 in a transmitter 200 to produce an RF signal 206. A second mixer 822*b* may mix 954 the output from the slave frequency divider 818*b* with the input signal to produce a second mixed output. For example, the second mixer 822*b* may mix 954 the output of the slave frequency divider 818*b* with an RF signal 806*b* in a receiver 100 to produce a baseband signal 114. Alternatively, the second mixer 822b may mix 954 the output of the slave frequency divider 818b with a baseband signal 214 in a transmitter 200 to produce an RF signal 206. The mixers 822 may be part of the modulation/demodulation process within a receiver 100 or transmitter 200.

The second mixed output may be forced 956 to be in phase with the first mixed output. This forcing 956 may be performed with cross-coupled switches 842 that are controlled by a control module 840. The cross-coupled switches 842 may be placed at any of the inputs or outputs of the mixers 822. The control module 840 may receive input from a phase detector 838 designed to detect any phase differences between signals in different segments 832. A summer 846 may sum 958 the first mixed output and the second mixed output. In other words, the synchronized outputs of the first segment 832a and second segment 832b may be summed 958 to produce an LO path output 824. By forcing 956 the first mixed output to be in phase with the second mixed output, the two segment 832 outputs may not unintentionally add up destructively.

Figure 10:
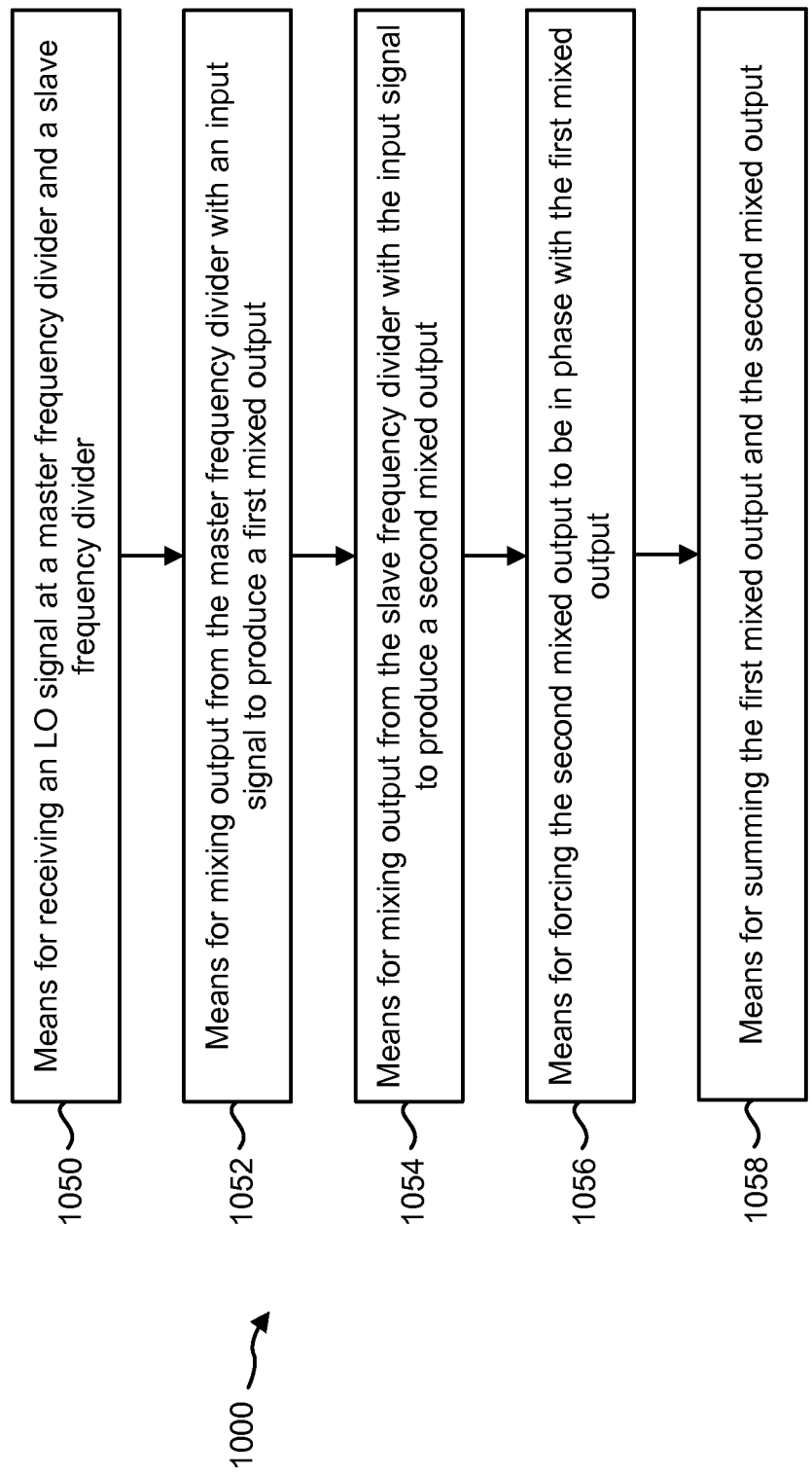
FIG. 10 illustrates means-plus-function blocks corresponding to the method of FIG. 9.

The method 900 of FIG. 9 described above may be performed by various hardware and/or software component(s) and/or module(s) corresponding to the means-plus-function blocks 1000 illustrated in FIG. 10. In other words, blocks 950 through 958 illustrated in FIG. 9 correspond to means-plus-function blocks 1050 through 1058 illustrated in FIG. 10.

Figure 11:
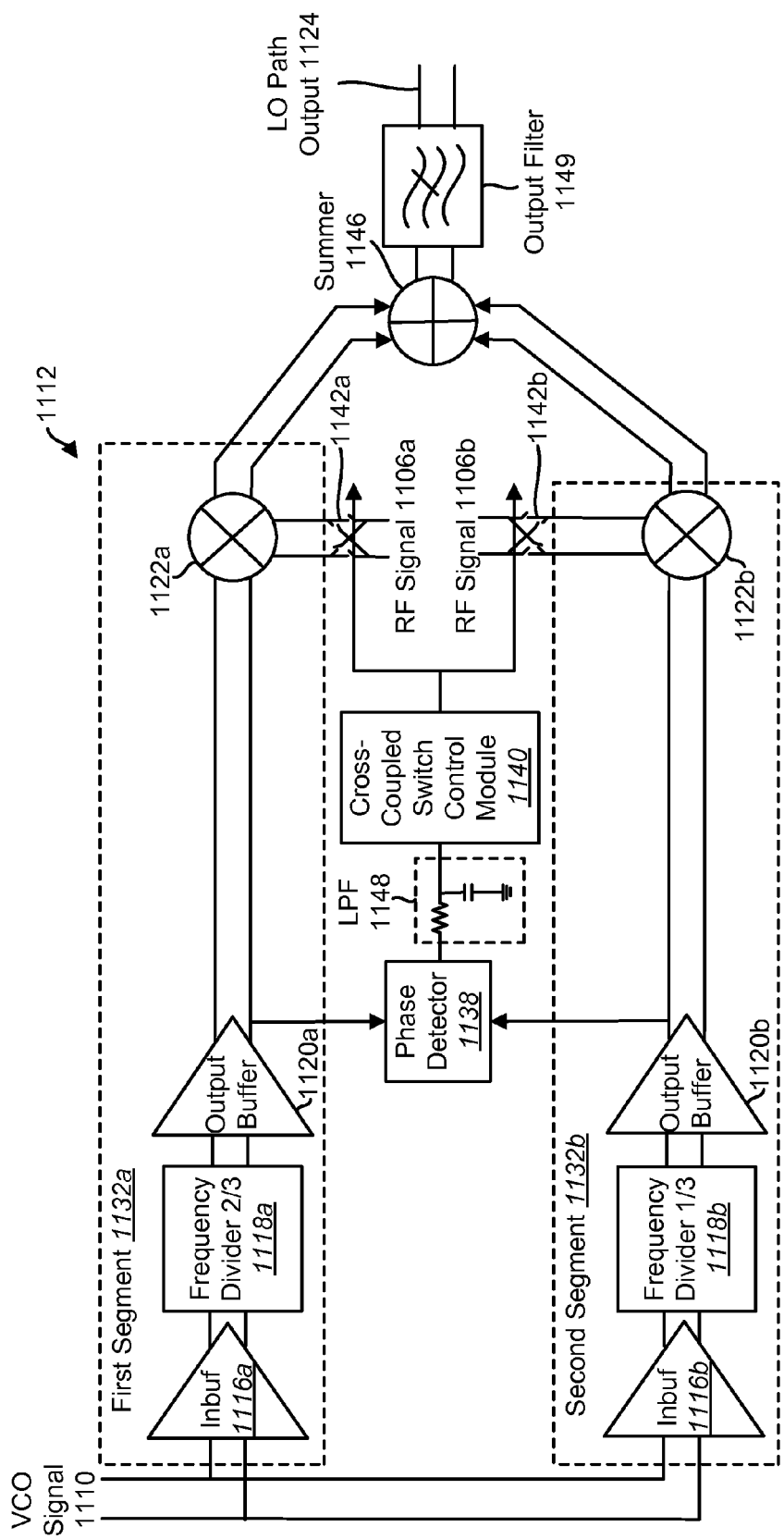
FIG. 11 is another block diagram illustrating an LO path that is fully split into synchronized segments.

FIG. 11 is another block diagram illustrating an LO path 1112 that is fully split into synchronized segments 1132a-b. The input buffers 1116a-b, frequency dividers 1118a-b, output buffers 1120a-b, mixers 1122a-b, summer 1146, low pass filter 1148, output filter 1149, phase detector 1138, control module 1140, and VCO signal 1110 illustrated in FIG. 11 may operate similarly to the input buffers 816a-b, frequency dividers 818a-b, output buffers 820a-b, mixers 822a-b, summer 846, low pass filter 848, output filter 849, phase detector 838, control module 840, and VCO signal 810 illustrated in FIG. 8. In this configuration, however, the cross-coupled switches 1142a-b may be on the RF signal 1106a-b for a receiver 100, or a baseband signal 214 input to a mixer 1122 in a transmitter 200. In other words, the polarity may be switched, if at all, on the RF input path to the mixers 1122. This may potentially degrade the noise performance of the LO path output 1124.

Figure 12:
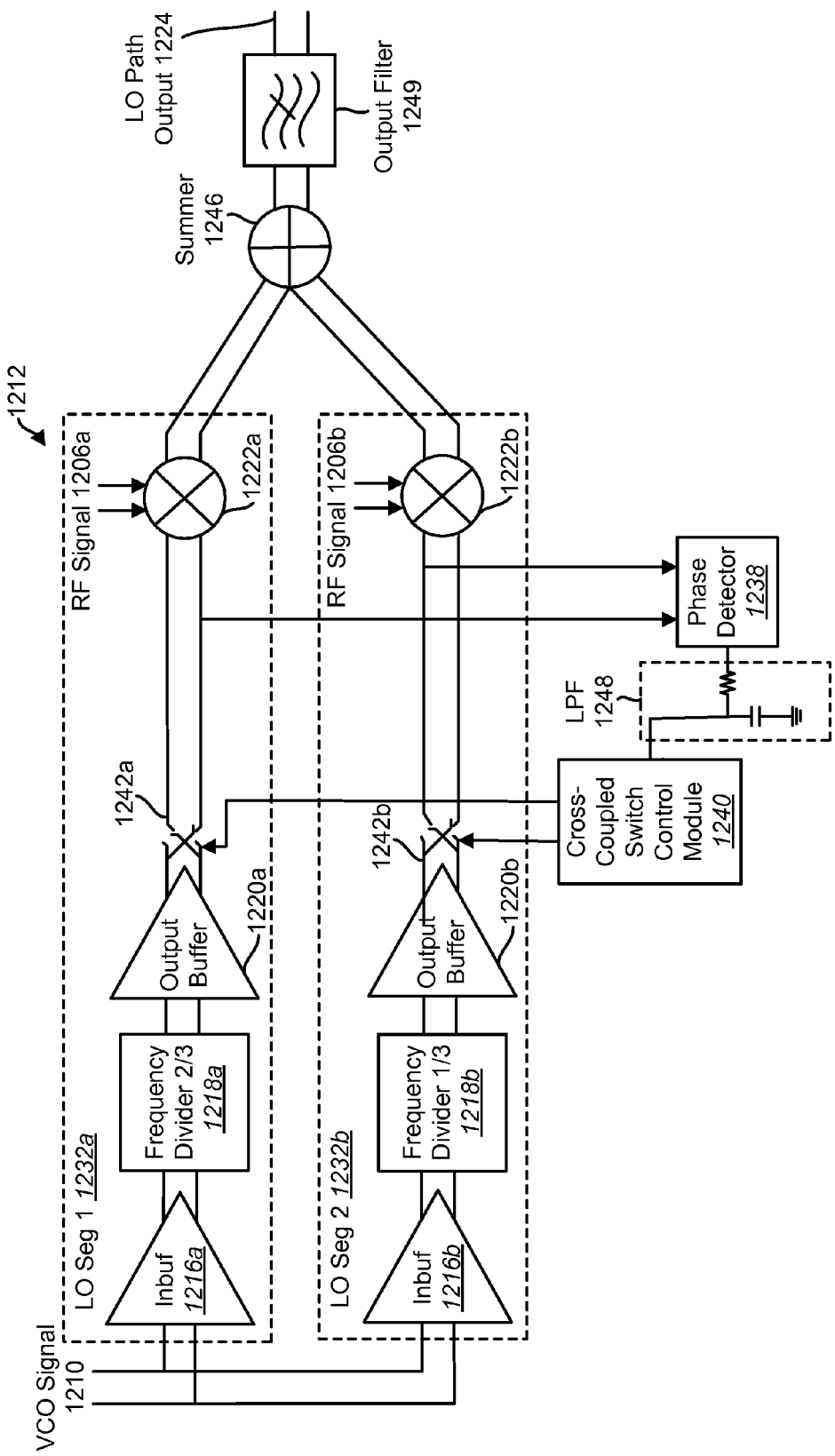
FIG. 12 is another block diagram illustrating an LO path that is fully split into synchronized segments.

FIG. 12 is another block diagram illustrating an LO path 1212 that is fully split into synchronized segments 1232a-b. The input buffers 1216a-b, frequency dividers 1218a-b, output buffers 1220a-b, mixers 1222a-b, RF signals 1206a-b, summer 1246, low pass filter 1248, output filter 1249, phase detector 1238, control module 1240, and VCO signal 1210 illustrated in FIG. 12 may operate similarly to the input buffers 816a-b, frequency dividers 818a-b, output buffers 820a-b, mixers 822a-b, RF signals 806a-b, summer 846, low pass filter 848, output filter 849, phase detector 838, control module 840, and VCO signal 810 illustrated in FIG. 8. In this configuration, however, the cross-coupled switches 1242a-b may be on the LO path 1212 after the output buffers 1220 or the frequency dividers 1218. In other words, the polarity may be switched, if at all, on the LO input to the mixers 1222. This may also potentially degrade phase noise at the LO path output 1224. Furthermore, the LO path 1212 may include a phase detector 1238 after the cross-coupled switches 1242 as opposed to earlier configurations with a phase detector 1138 preceding the cross-coupled switches 1142.

Figure 13:
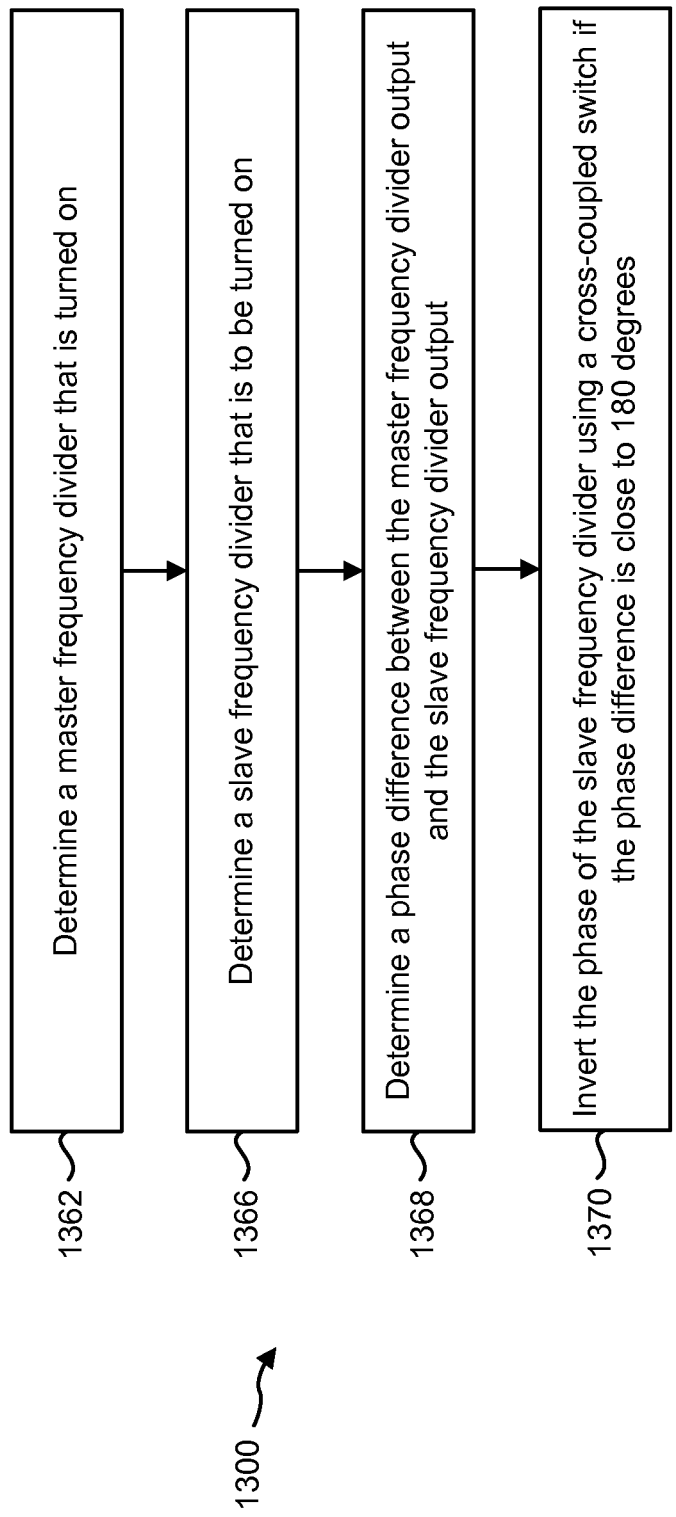
FIG. 13 is a flow diagram of a method for synchronizing two fully split LO path segments.

FIG. 13 is a flow diagram of a method 1300 for synchronizing two fully split LO path segments 832. The method 1300 may be performed by a control module 840. The control module 840 may determine 1362 a master frequency divider 818a that is turned on. As described above, a master frequency divider 818a may be a powered-on divider with a phase that should be matched by any other frequency dividers 818 subsequently turned on, i.e., the master frequency divider 818a is the first divider to turn on. The control module 840 may also determine 1366 a slave frequency divider 818b that is to be turned on. There may be more than one slave frequency divider 818b depending on the configuration of the LO path 812 and the desired mode of operation. The control module 840 may also determine 1368 a phase difference between the master frequency divider 818a output and the slave frequency divider 818b output. This may include using a phase detector 838. The phase detector 838 may measure the phase of the master frequency divider 818a at the output of the master frequency divider 818a or at the output of an output buffer 820a. Likewise, the phase detector 838 may measure the phase of the slave frequency divider 818b at the output of the slave frequency divider 818b or at the output of an output buffer 820b. The control module 840 may also invert 1370 the phase of the output from the slave frequency divider 818b using a cross-coupled switch 842b if the phase difference is close to 180 degrees. The phases difference may be 180 degrees or 0 degrees with an error of 5 degrees, e.g., 175-185 degrees or 355-5 degrees. Therefore, inverting 1370 the polarity of a slave frequency divider 818b that is close to 180 degrees out of phase with a master frequency divider 818a may synchronize the phases of the segments 832.

Figure 14:
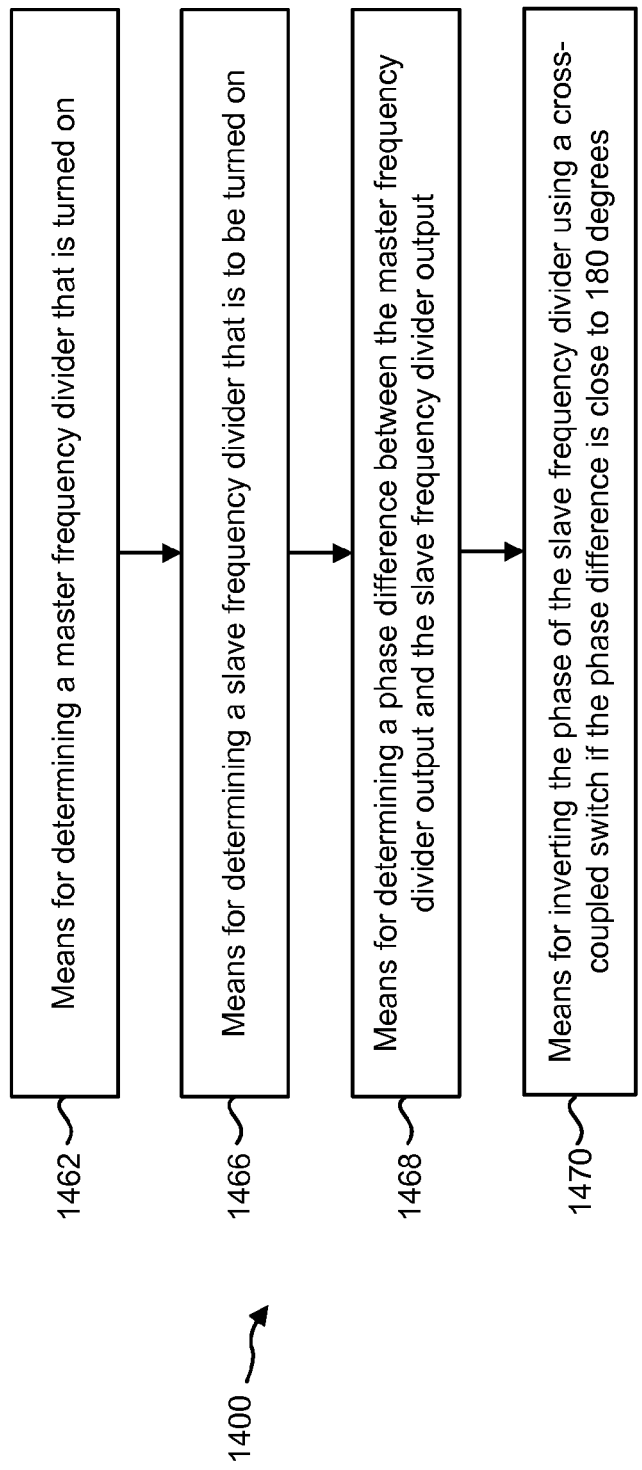
FIG. 14 illustrates means-plus-function blocks corresponding to the method of FIG. 13.

The method 1300 of FIG. 13 described above may be performed by various hardware and/or software component(s) and/or module(s) corresponding to the means-plus-function blocks 1400 illustrated in FIG. 14. In other words, blocks 1362 through 1370 illustrated in FIG. 13 correspond to means-plus-function blocks 1462 through 1470 illustrated in FIG. 14.

Figure 15:
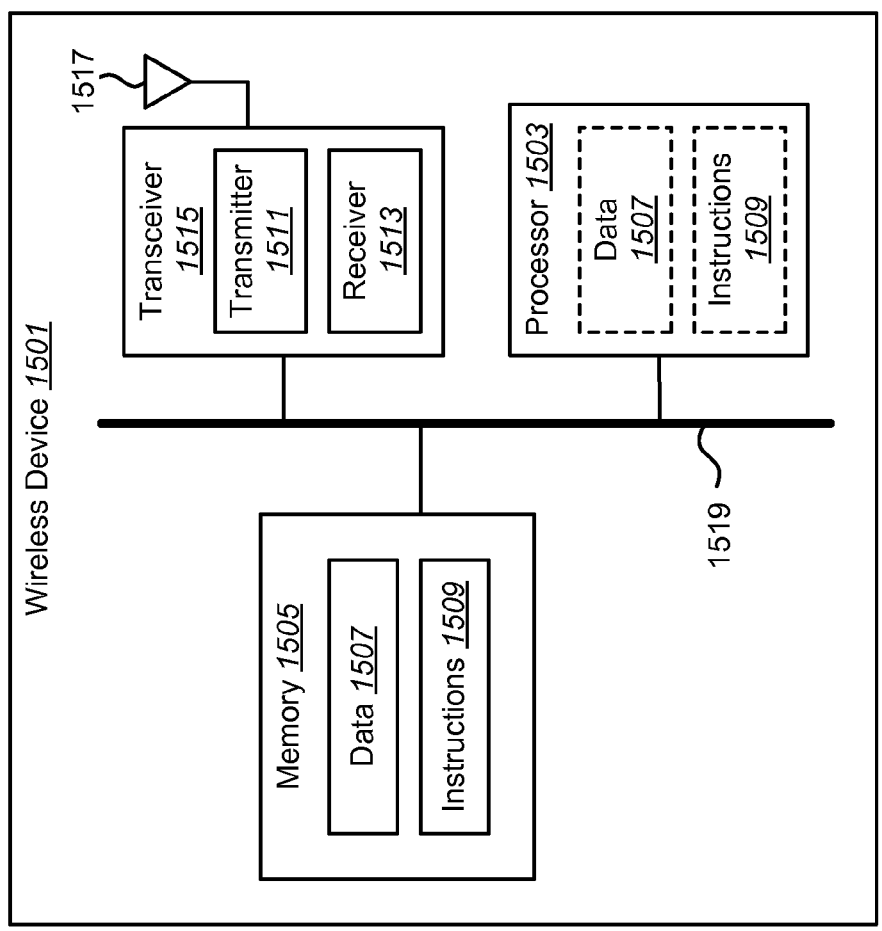
FIG. 15 illustrates certain components that may be included within a wireless device.

FIG. 15 illustrates certain components that may be included within a wireless device 1501. The wireless device 1501 may be a mobile device or a base station. Specifically, the wireless device 1501 may be a mobile device that includes a receiver 100 as illustrated in FIG. 1 and/or a transmitter 200 illustrated in FIG. 2 with an LO path 812 fully split into segments.

The wireless device 1501 includes a processor 1503. The processor 1503 may be a general purpose single- or multi-chip microprocessor (e.g., an ARM), a special purpose microprocessor (e.g., a digital signal processor (DSP)), a microcontroller, a programmable gate array, etc. The processor 1503 may be referred to as a central processing unit (CPU). Although just a single processor 1503 is shown in the wireless device 1501 of FIG. 15, in an alternative configuration, a combination of processors (e.g., an ARM and DSP) could be used.

The wireless device 1501 also includes memory 1505. The memory 1505 may be any electronic component capable of storing electronic information. The memory 1505 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1507 and instructions 1509 may be stored in the memory 1505. The instructions 1509 may be executable by the processor 1503 to implement the methods disclosed herein. Executing the instructions 1509 may involve the use of the data 1507 that is stored in the memory 1505.

The wireless device 1501 may also include a transmitter 1511 and a receiver 1513 to allow transmission and reception of signals between the wireless device 1501 and a remote location. The transmitter 1511 and receiver 1513 may be collectively referred to as a transceiver 1515. An antenna 1517 may be electrically coupled to the transceiver 1515. The wireless device 1501 may also include (not shown) multiple transmitters, multiple receivers, multiple transceivers and/or multiple antenna.

The various components of the wireless device 1501 may be coupled together by one or more buses, which may include a power bus, a control signal bus, a status signal bus, a data bus, etc. For the sake of clarity, the various buses are illustrated in FIG. 15 as a bus system 1519.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 9 and 13, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for reducing average current consumption in a local oscillator (LO) path, comprising:
   receiving an LO signal at a master frequency divider and a slave frequency divider;
   mixing output from the master frequency divider with an input signal to produce a first mixed output;
   mixing output from the slave frequency divider with the input signal to produce a second mixed output; and
   forcing the second mixed output to be in phase with the first mixed output wherein the forcing comprises:
   determining a phase difference between the output from the master frequency divider and the output from the slave frequency divider; and
   inverting a phase of the slave frequency divider using a cross-coupled switch based on the phase difference.

2. The method of claim 1, wherein the inverting comprises inverting the output from the slave frequency divider.

3. The method of claim 1, wherein the inverting comprises inverting the second mixed output.

4. The method of claim 1, wherein the inverting comprises inverting the input signal before the input signal is mixed with the output from the slave frequency divider.

5. The method of claim 1, further comprising summing the first mixed output and the second mixed output.

6. The method of claim 1, wherein the input signal is a radio frequency signal and the first mixed output and the second mixed output are baseband signals.

7. The method of claim 1, wherein the input signal is a baseband signal and the first mixed output and the second mixed output are radio frequency signals.

8. The method of claim 1, wherein the local oscillator (LO) signal is generated by a voltage controlled oscillator (VCO).

9. The method of claim 1, wherein the output from the master frequency divider has been buffered by a first output buffer and the output from the slave frequency divider has been buffered by a second output buffer.

10. The method of claim 1, wherein the slave frequency divider is powered on in response to a change in gain requirements for the local oscillator (LO) path.

11. A fully split local oscillator (LO) path, comprising:
a master frequency divider and a slave frequency divider configured to receive an LO signal;
a first mixer configured to mix output from the master frequency divider with an input signal to produce a first mixed output;
a second mixer configured to mix output from the slave frequency divider with the input signal to produce a second mixed output;
a control module configured to force the second mixed output to be in phase with the first mixed output;
a phase detector configured to determine a phase difference between the output from the master frequency divider and the output from the slave frequency divider; and
a cross-coupled switch configured to invert a phase of the slave frequency divider based on the phase difference.

12. The local oscillator (LO) path of claim 11, wherein the cross-coupled switch is further configured to invert the output from the slave frequency divider.

13. The local oscillator (LO) path of claim 11, wherein the cross-coupled switch is further configured to invert the second mixed output.

14. The local oscillator (LO) path of claim 11, wherein the cross-coupled switch is further configured to invert the input signal before the input signal is mixed with the output from the slave frequency divider.

15. The local oscillator (LO) path of claim 11, further comprising a summer configured to sum the first mixed output and the second mixed output.

16. The local oscillator (LO) path of claim 11, wherein the input signal is a radio frequency signal and the first mixed output and the second mixed output are baseband signals.

17. The local oscillator (LO) path of claim 11, wherein the input signal is a baseband signal and the first mixed output and the second mixed output are radio frequency signals.

18. The local oscillator (LO) path of claim 11, further comprising a voltage controlled oscillator (VCO) configured to generate the LO signal.

19. The local oscillator (LO) path of claim 11, further comprising a first output buffer configured to buffer the output from the master frequency divider and a second output buffer configured to buffer the output from the slave frequency divider.

20. The local oscillator (LO) path of claim 11, wherein the slave frequency divider is powered on in response to a change in gain requirements for the LO path.

21. A fully split local oscillator (LO) path, comprising:
means for receiving an LO signal at a master frequency divider and a slave frequency divider;
means for mixing output from the master frequency divider with an input signal to produce a first mixed output;
means for mixing output from the slave frequency divider with the input signal to produce a second mixed output;
means for forcing the second mixed output to be in phase with the first mixed output means for determining a phase difference between the output from the master frequency divider and the output from the slave frequency divider; and
means for inverting a phase of the slave frequency divider using a cross-coupled switch based on the phase difference.

22. The local oscillator (LO) path of claim 21, wherein the means for inverting comprises means for inverting the output from the slave frequency divider.

23. The local oscillator (LO) path of claim 21, wherein the means for inverting comprises means for inverting the second mixed output.

24. The local oscillator (LO) path of claim 21, wherein the means for inverting comprises means for inverting the input signal before the input signal is mixed with the output from the slave frequency divider.

25. The local oscillator (LO) path of claim 21, wherein the slave frequency divider is powered on in response to a change in gain requirements for the LO path.

26. A computer-readable medium encoded with computer-executable instructions, wherein execution of the computer-executable instructions is for:
receiving an LO signal at a master frequency divider and a slave frequency divider;
mixing output from the master frequency divider with an input signal to produce a first mixed output;
mixing output from the slave frequency divider with the input signal to produce a second mixed output;
forcing the second mixed output to be in phase with the first mixed output
determining a phase difference between the output from the master frequency divider and the output from the slave frequency divider; and
inverting the phase of the slave frequency divider using a cross-coupled switch based on the phase difference.

27. The computer-readable medium of claim 26, wherein the instructions for inverting comprise instructions for inverting the output from the slave frequency divider.

28. The computer-readable medium of claim 26, wherein the instructions for inverting comprise instructions for inverting the second mixed output.

29. The computer-readable medium of claim 26, wherein the instructions for inverting comprise instructions for inverting the input signal before the input signal is mixed with the output from the slave frequency divider.

30. The computer-readable medium of claim 26, wherein the slave frequency divider is powered on in response to a change in gain requirements for an LO path associated with the master frequency divider and the slave frequency divider.

* * * * *